United States Patent
Kuo

(10) Patent No.: US 6,319,066 B2
(45) Date of Patent: Nov. 20, 2001

(54) COMPACT ELECTRICAL ADAPTER FOR MOUNTING TO A PANEL CONNECTOR OF A COMPUTER

(75) Inventor: Chin-Pao Kuo, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/753,795

(22) Filed: Jan. 2, 2001

(30) Foreign Application Priority Data

Mar. 31, 2000 (TW) ........................................ 088121901A01

(51) Int. Cl.⁷ .................................................... H01R 25/00
(52) U.S. Cl. .......................................... 439/638; 439/76.1
(58) Field of Search ................................... 439/76.1, 638, 439/83, 76.2

(56) References Cited

U.S. PATENT DOCUMENTS

| | | | |
|---|---|---|---|
| 3,551,874 | * 12/1970 | Volinskie | 439/76.1 |
| 5,507,654 | * 4/1996 | Daly et al. | 439/76.1 |
| 5,764,487 | * 6/1998 | Natsume | 439/76.2 |
| 6,129,557 | * 10/2000 | Blaszczyk et al. | 439/76.1 |
| 6,129,560 | * 10/2000 | Baur et al. | 439/76.1 |
| 6,146,153 | * 11/2000 | Koradia et al. | 439/638 |
| 6,162,990 | * 12/2000 | Sakamoto | 439/76.2 |

\* cited by examiner

*Primary Examiner*—Tho D. Ta
(74) *Attorney, Agent, or Firm*—Wei Te Chung

(57) ABSTRACT

An adapter (100) comprises an elongate printed circuit board (PCB) (10) having a first surface (12) and a second surface (14) opposite the first surface (12), a first connector (20) mounted to the first surface of the PCB and a second connector (30) mounted to the second surface of the PCB. The first connector (20) has a mating port (242) facing away from and oriented perpendicular to the first surface of the PCB. The second connector (30) has a mating face (322) facing away from and oriented perpendicular to the second surface of the PCB.

5 Claims, 5 Drawing Sheets

COMPACT ELECTRICAL ADAPTER FOR MOUNTING TO A PANEL CONNECTOR OF A COMPUTER

BACKGROUND OF THE INVENTION

The present invention relates to an electrical adapter, and particularly to an electrical adapter for electrically connecting two different electrical devices having incompatible electrical connectors.

As computer technology evolves, new types of electrical devices with advanced functions are developed which are equipped with connectors having new configurations. An adapter is needed to connect a cable connector assembly having an older design with a device connector having a new design, as is provided on certain newly developed devices (for example, new types of computers). Conventional adapters include two connectors at either end wherein one is configured to mate with a connector for a new type computer, and the other is configured to mate with a conventional cable connector assembly.

The connectors of the conventional adapter are usually interconnected using a flat cable, a single printed circuit board (PCB), or discrete conducting wires. The individual conductors of the flat cable and the discrete conducting wires must be connected to terminals of the separate connectors in the adapter by soldering, and production is necessarily inefficient and complicated. Alternatively, prior art adaptors have connectors mounted at elongate ends of a single PCB of the adapter, both mating ports of the connectors being oriented parallel to a main surface of the single PCB. When one of the connectors of the adapter is engaged with a connector mounted on a panel of a computer, the PCB of the adapter is vertical to the panel thereby occupying a large space outside of the panel.

Therefore, an improved adapter occupying a small space when mated to a connector mounted on a computer panel is desired.

SUMMARY OF THE INVENTION

The main object of the present invention is to provide an adapter for connecting a connector having a new design and mounted on a newly developed electrical device with a conventional cable connector assembly, wherein the adapter occupies a small space outside the new electrical device when it is connected to the connector thereof.

An adapter in accordance with the present invention comprises an elongate printed circuit board (PCB) having a first surface and a second surface, a first connector mounted to the first surface of the PCB and a second connector mounted to the second surface of the PCB. The first connector has a mating port facing away from and oriented perpendicular to the first surface of the PCB. The second connector has a mating face facing away from and oriented perpendicular to the second surface of the PCB.

Other objects, advantages and novel features of the invention will become more apparent from the following detailed description of the present embodiment when taken in conjunction with the accompanying drawings.

DETAILED DESCRIPTION OF THE INVENTION

Figure 1:
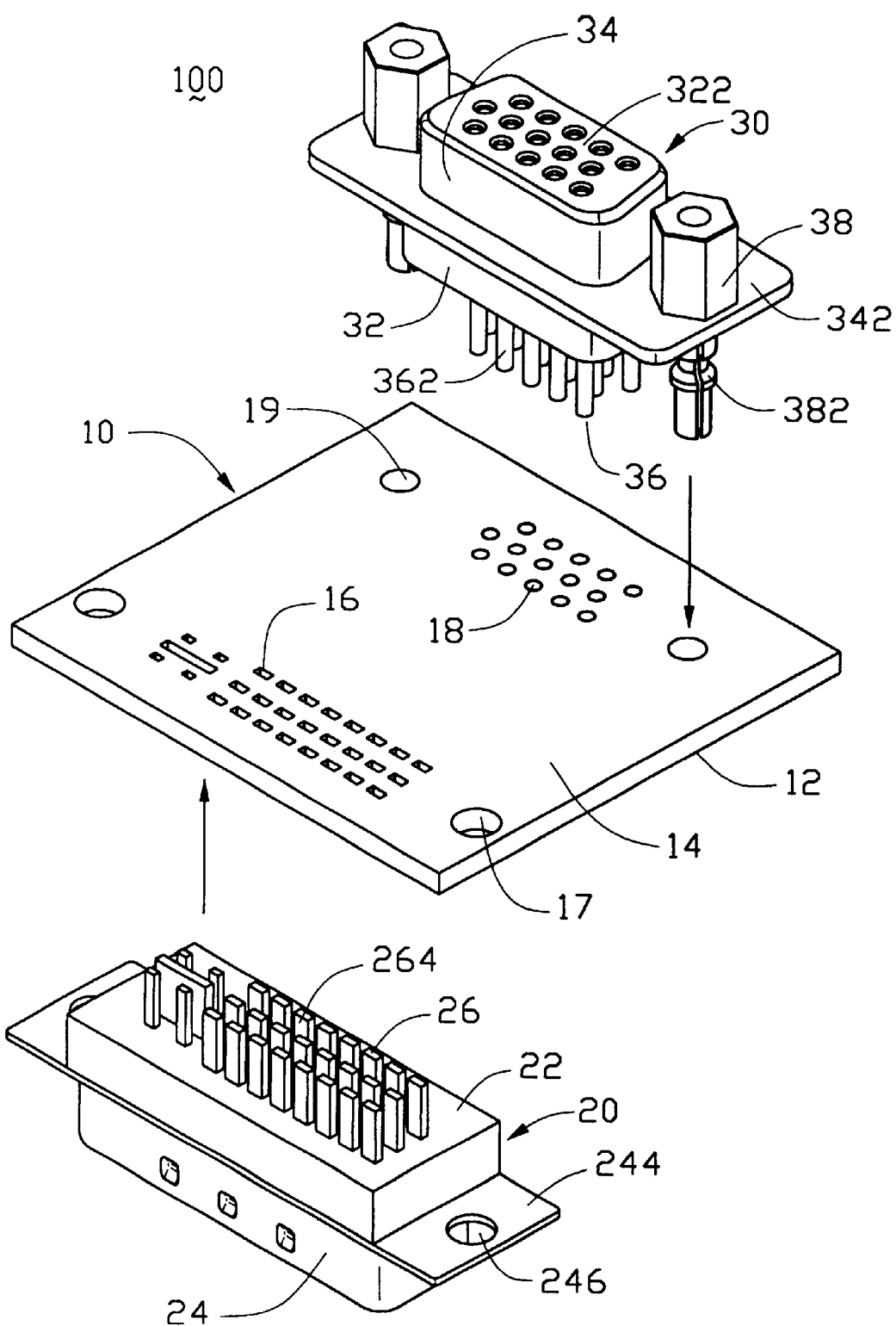
FIG. 1 is a partly exploded view of an adapter of the present invention without insulation and screws.

Referring to FIG. 1, an adapter 100 includes a printed circuit board (PCB) 10, a first connector 20 and a second connector 30.

The PCB 10 comprises a first surface 12 and an opposite second surface 14, and defines therethrough a first group of rectangular through holes 16 at a first end of the PCB 10, a pair of assembling holes 17 beside the rectangular through holes 16, a second group of round through holes 18 at a second end of the PCB 10 opposite the first end, and a pair of fixing holes 19 beside the second group of round through holes 18. All of the first and second groups of through holes 16 and 18 and the assembling and fixing holes 17, 19 extend through the first surface 12 and the second surface 14 of the PCB 10. The first group of rectangular through holes 16 is offset from the second group of round through holes 18. A distance is defined between the first group of rectangular through holes 16 and the second group of round through holes 18.

Referring to FIGS. 1 to 4, the first connector 20 comprises an insulative first housing 22, a first shield 24 shrouding the first housing 22 and a plurality of first electrical terminals 26 received in the first housing 22. The first shield 24 comprises a mating port 242 and a first flange 244 formed at the sides of the mating port 242. The first flange 244 has a pair of mounting holes 246 at lateral ends thereof. The mounting holes 246 align with the assembling holes 17 of the PCB 10 when the first connector 20 is mounted to the first surface 12 of the PCB 10 by extending the first electrical terminals 26 through the rectangular through holes 16. The first electrical terminals 26 each comprise a first mating end 262 at one end thereof extending into the mating port 242 of the first shield 24 and a first mounting end 264 at the other end thereof extending beyond one side of the first housing 22 for soldering to the PCB 10.

The second connector 30 comprises an insulative second housing 32, a second shield 34 shrouding the second housing 32, a plurality of second electrical terminals 36 received in the second housing 32 and a pair of screw caps 38 assembled at lateral ends of the second connector 30. The second housing 32 has a mating face 322. Each second electrical terminal 36 comprises a second mounting end 362 extending beyond the second housing 32 for mounting to the PCB 10 and an opposite second mating end (not labeled) extending through the second housing 32 to the mating face 322. The second shield 34 comprises a second flange 342. The screw caps 38 are positioned at lateral ends of the second flange 342.

Figure 2:
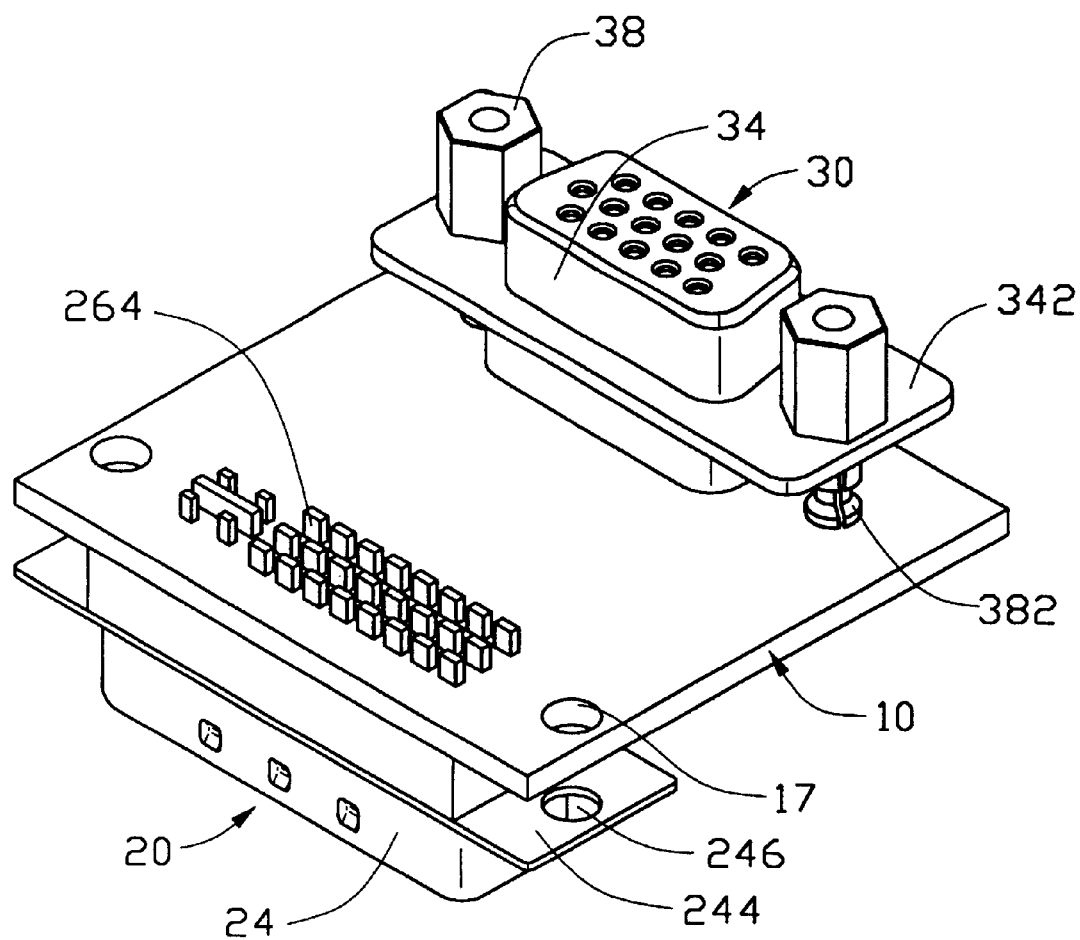
FIG. 2 is an assembled view of FIG. 1.

Referring to FIG. 2, in assembly, the first mounting ends 264 of the first electrical terminals 26 of the first connector 20 are extended through the first group of rectangular through holes 16 of the PCB 10 and then soldered thereto, whereby the first connector 20 is mounted to the first surface 12 of the PCB 10. The second mounting ends 362 of the second electrical terminals 36 are extended through the second group of round through holes 18 of the PCB 10 and then soldered thereto, whereby the second connector 30 is mounted to the second surface 14 of the PCB 10. The screw caps 38 each have a board lock 382 extending through a corresponding fixing holes 19 of the PCB 10 and are securely positioned therein when the second connector 30 is mounted to the PCB 10.

The first connector 20 is offset from the second connector 30 with a distance along a vertical direction from the first end of the PCB to the second end of the PCB.

Figure 3:
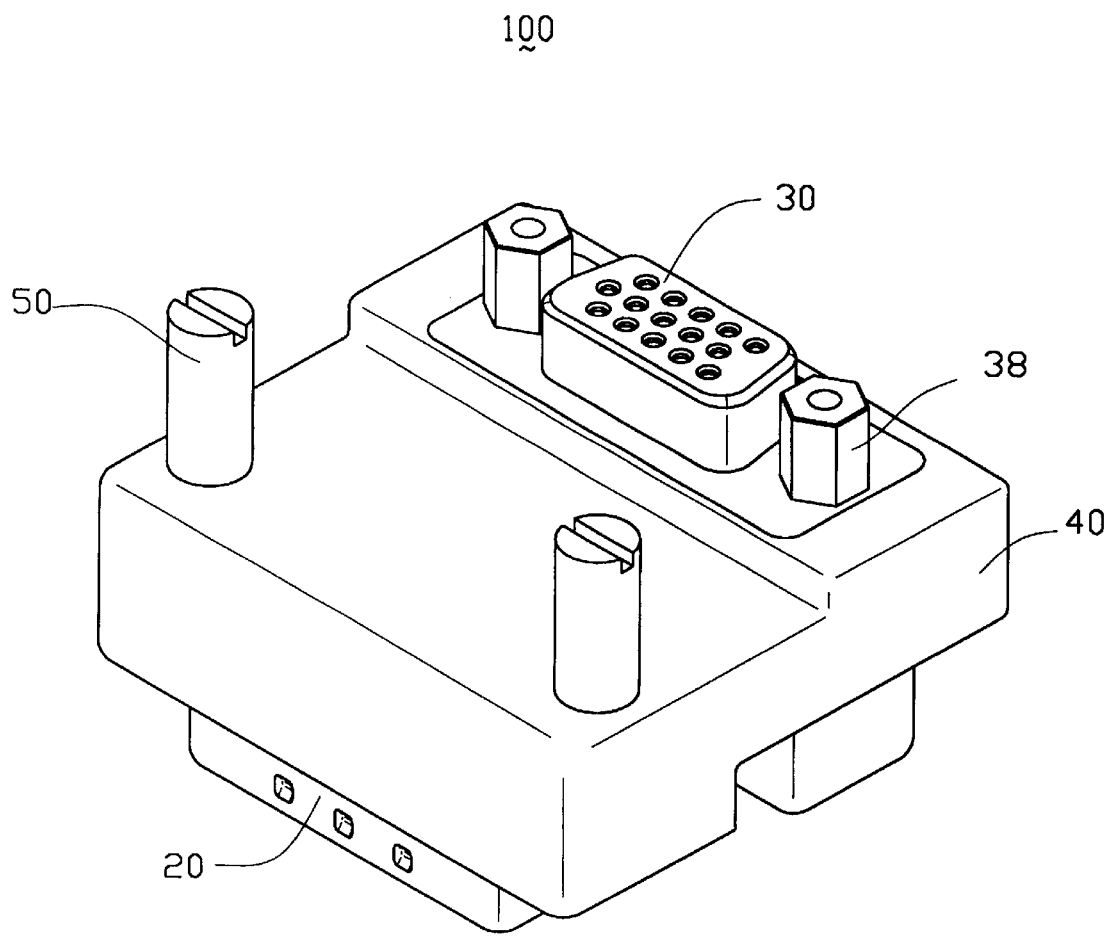
FIG. 3 is an assembled view of the adapter of FIG. 1 after insert molding with insulation.
Figure 4:
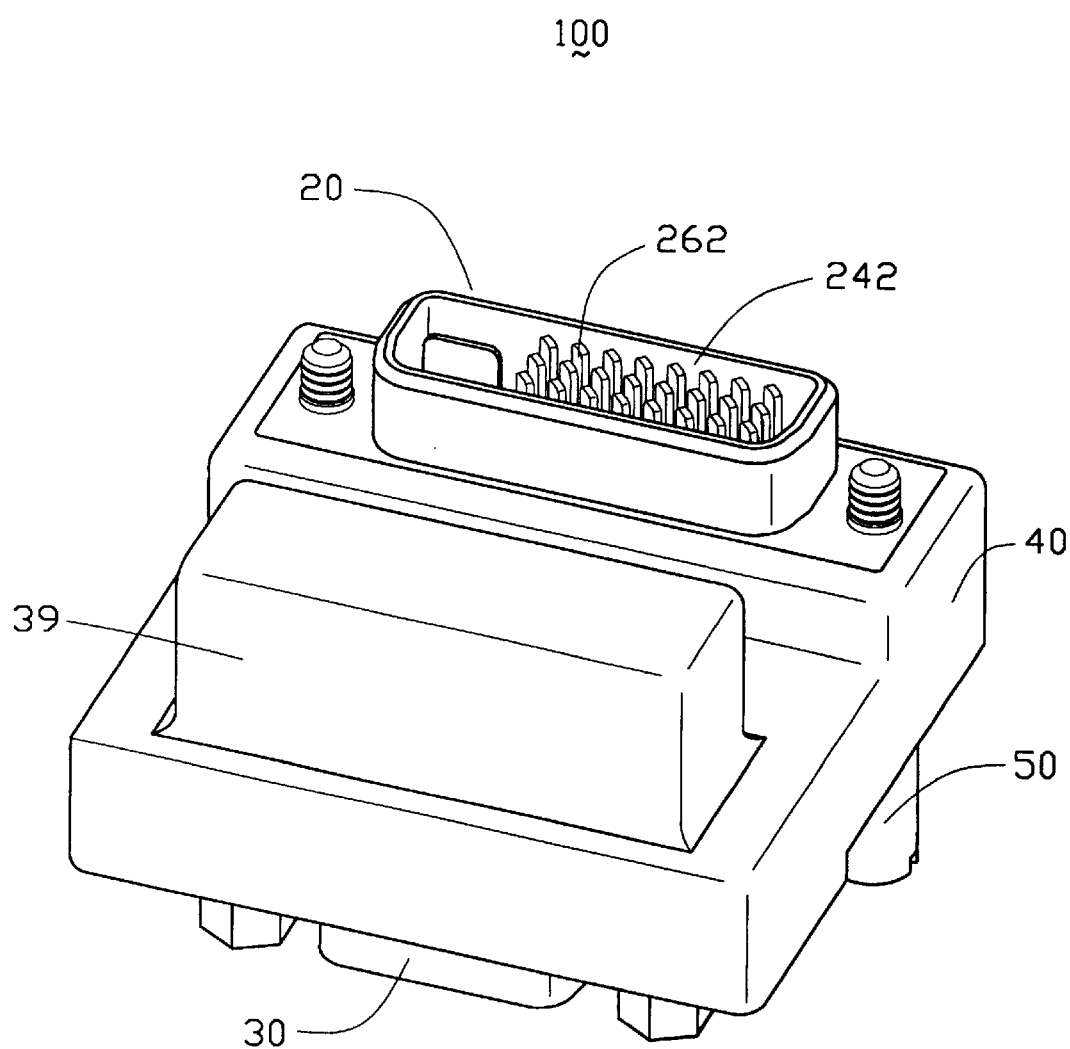
FIG. 4 is an upside-down view of FIG. 3.
Figure 5:
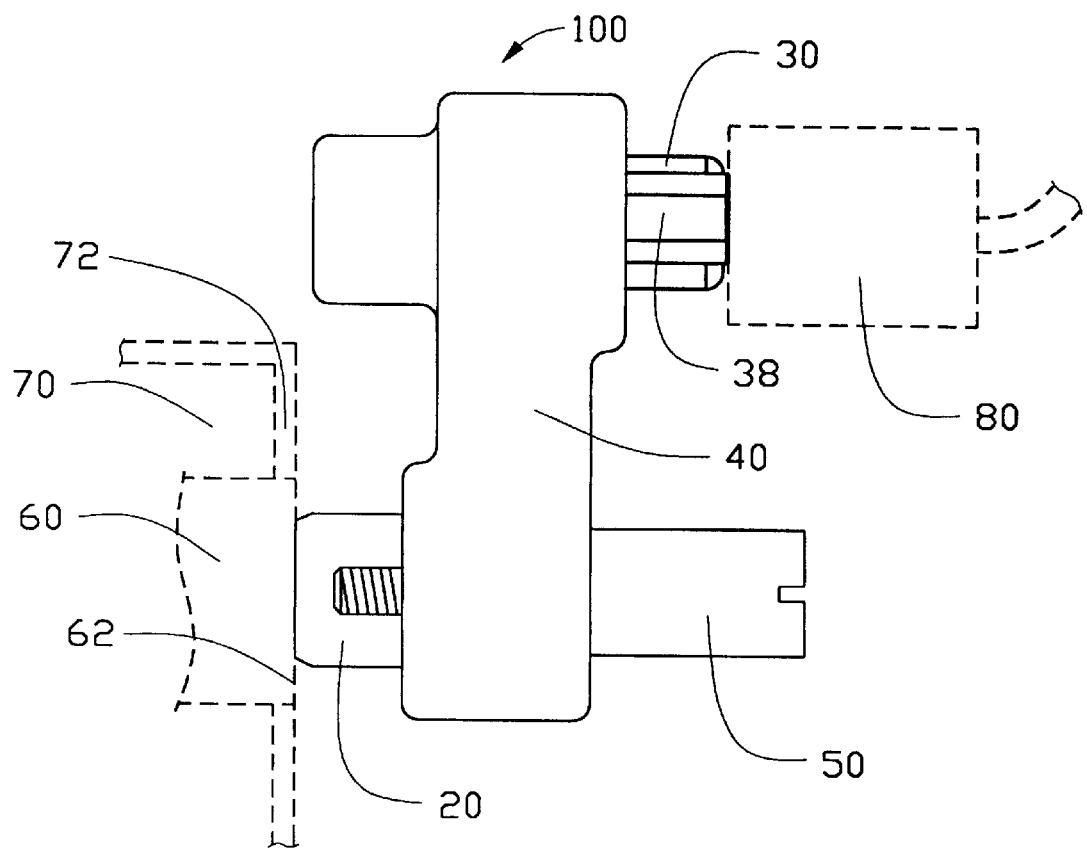
FIG. 5 is a side view of the adapter of FIG. 3 with a first connector mating with a connector of a computer mainframe and a second connector mating with a cable connector assembly.

Referring to FIGS. 3 and 4, after the above assembly, the sub-assembly is subject to an insert molding process whereby an insulator 40 encloses the PCB 10 and rearward portions of the first connector 20 and the second connector 30 to complete the adapter 100. The second connector comprises a projection 39 projecting from the first surface 12 of the PCB 10 enclosing the rear portion of the second connector 30 and being adjacent to the mating port 242 of the first connector 20. The mating portion 242 of the first connector 20, the mating face 322 of the second connector 30 and the screw caps 38 are exposed for engaging with corresponding mating connectors and screws. The adapter 100 further comprises a pair of elongate screws 50 assembled to the first connector 20. A threaded end of each screw 50 extends through the assembling hole 17 of the PCB 10 and the mounting hole 246 of the first connector 20 for screwing with a corresponding screw cap of a panel connector 60 in a computer 70 (as shown in FIG. 5). The panel connector 60 has a mating face 62 exposing to a panel 72 of an electrical device.

Referring to FIG. 5, when the first connector 20 of the adapter 100 mates with the connector 60 in the computer 70 and the second connector 30 of the adapter 100 mates with a cable connector assembly 80, the PCB 10 of the adapter 100 is substantially parallel to the panel 72 of the computer 70 thereby reducing a distance between the second connector 30 and the computer 70. Therefore, space occupied by the adapter outside of the panel of the computer is substantially reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An adapter, comprising:
    a printed circuit board (PCB) having a first surface and a second surface opposite the first surface, the PCB having a first end and a second end opposite the first end;
    a first connector having a plurality of first electrical terminals received therein, the first connector being mounted to the first end on the first surface of the PCB with the terminals extending through and soldered with the PCB, the first connector having a mating port facing away from and oriented perpendicular to the first surface of the PCB;
    a second connector having a plurality of second electrical terminals received therein, the second connector being mounted to the second end on the second surface of the PCB with the terminals extending through and soldered with the PCB, the second connector having a mating port facing away from and oriented perpendicular to the second surface of the PCB, the first connector being offset from the second connector with a distance along a vertical direction from the first end of the PCB to the second end of the PCB; and
    said adapter further includes a pair of screw caps exposed on the first surface for mating with corresponding screws of a first mating connector, and a pair of screws extending through the second surface, with a pair of operating screw heads exposed on the first surface, for screwing with corresponding screw caps of a second mating connector.

2. The adapter as claimed in claim 1, wherein the adapter further comprises an insulator enclosing the PCB and rearward portions of the first connector and the second connector, the mating port of the first connector and the mating port of the second connector exposing from the insulator.

3. The adapter as claimed in claim 2, wherein the first connector comprises a pair of screws assembled therewith for screwing with a first mating connector and the second connector comprises a pair of screw caps positioned at lateral ends thereof for screwing with a second mating connector.

4. The adapter as claimed in claim 2, wherein the second connector comprises a projection projecting from the first face of the PCB enclosing the rear portion of the second connector and being adjacent to the mating port of the first connector.

5. An adapter assembly, comprising:
    a panel connector which has a mating face exposing to a panel of an electrical device;
    an adapter engaging with the panel connector exposing to the panel of the electrical device, comprising:
        a printed circuit board (PCB) having a first surface and a second surface opposite the first surface, the PCB having a first end and a second end opposite the first end;
        a first connector having a plurality of first electrical terminals received therein, the first connector being mounted to the first end on the first surface of the PCB with the terminals extending through and soldered with the PCB, the first connector having a mating port facing away from and oriented perpendicular to the first surface of the PCB;
        a second connector having a plurality of second electrical terminals received therein, the second connector being mounted to the second end on the second surface of the PCB with the terminals extending through and soldered with the PCB, the second connector having a mating port facing away from and oriented perpendicular to the second surface of the PCB, the first connector being offset from the second connector with a distance along a vertical direction from the first end of the PCB to the second end of the PCB;
    wherein the first connector of the adapter engages with the panel connector of the electrical device, and the PCB of the adapter is substantially parallel to the panel of the electrical device thereby reducing a distance between the second connector of the adapter and the panel of the electrical device; and
    said adapter further includes a pair of screw caps exposed on the first surface for mating with corresponding screws of a first mating connector, and a pair of screws extending through the second surface, with a pair of operating screw heads exposed on the first surface, for screwing with corresponding screw caps of a second mating connector.

* * * * *